US007298852B2

(12) United States Patent
Croft, III

(10) Patent No.: US 7,298,852 B2
(45) Date of Patent: Nov. 20, 2007

(54) DYNAMIC POWER SHARING IN A MULTI-CHANNEL SOUND SYSTEM

(75) Inventor: James J. Croft, III, Poway, CA (US)

(73) Assignee: American Technology Corporation, San Diego, CA (US)

(*) Notice: Subject to any disclaimer, the term of this patent is extended or adjusted under 35 U.S.C. 154(b) by 473 days.

(21) Appl. No.: 10/332,660

(22) PCT Filed: Jul. 11, 2001

(86) PCT No.: PCT/US01/21755

§ 371 (c)(1),
(2), (4) Date: Jun. 12, 2003

(87) PCT Pub. No.: WO02/05261

PCT Pub. Date: Jan. 17, 2002

(65) Prior Publication Data

US 2004/0037440 A1 Feb. 26, 2004

(51) Int. Cl.
*H04R 29/00* (2006.01)
*H04R 5/02* (2006.01)
*H04B 1/00* (2006.01)
*H03G 3/00* (2006.01)

(52) U.S. Cl. .......................... 381/56; 381/55; 381/119; 381/307; 381/104; 330/207 P

(58) Field of Classification Search .................. 381/55, 381/307, 119, 56, 104, 77, 107; 330/207 P
See application file for complete search history.

(56) References Cited

U.S. PATENT DOCUMENTS

| | | | |
|---|---|---|---|
| 4,048,573 A | 9/1977 | Evans et al. | |
| 4,327,250 A | 4/1982 | Von Recklinghausen | |
| 4,525,855 A | 6/1985 | Willcocks | |
| 5,148,491 A | 9/1992 | Sakamoto et al. | |
| 5,245,229 A * | 9/1993 | Colvin, Sr. | 327/361 |
| 5,307,415 A * | 4/1994 | Fosgate | 381/22 |
| 5,583,962 A | 12/1996 | Davis et al. | |
| 5,652,800 A * | 7/1997 | Roberts | 381/119 |
| 5,774,567 A * | 6/1998 | Heyl | 381/119 |
| 5,873,065 A | 2/1999 | Akagiri et al. | |
| 6,501,717 B1 * | 12/2002 | Yamazaki | 369/47.16 |
| 6,704,421 B1 * | 3/2004 | Kitamura | 381/103 |
| 2005/0129256 A1 * | 6/2005 | Metcalf | 381/119 |

FOREIGN PATENT DOCUMENTS

| | | |
|---|---|---|
| JP | 61-84909 | 4/1986 |
| JP | 2 026500 | 1/1990 |
| JP | 2000 059896 | 2/2000 |
| WO | WO 00/04744 | 1/2000 |

* cited by examiner

*Primary Examiner*—Vivian Chin
*Assistant Examiner*—Devona E. Faulk
(74) *Attorney, Agent, or Firm*—Thorpe North & Western LLP

(57) ABSTRACT

A signal processing system for use in a multichannel audio system. The signal processing system includes a first channel having a first audio signal. A second channel is included that has at least a second audio signal. A processor is included that is responsive to a signal level threshold in the first channel, such that at the threshold and above the threshold, a portion of the first channel audio signal is mixed into the at least a second audio channel.

43 Claims, 8 Drawing Sheets

DYNAMIC POWER SHARING IN A MULTI-CHANNEL SOUND SYSTEM

TECHNICAL FIELD

The present invention relates generally to multiple channel sound systems. More particularly, the present invention relates to power distribution in multiple channel sound systems.

BACKGROUND ART

In today s home entertainment industry, high fidelity, spatially accurate sound is very important and surround sound systems are a predominant delivery system for sound reproduction. Surround sound systems typically have 5 or more channels and at least one woofer or sub-woofer channel. A surround sound system generally uses the front center channel(s) for human voice and the dominant sounds in the program source, or for sounds which are meant have a sonic image centered with picture. The additional channels are used for special effects or other sounds, which have non-center front image placement or spatial movement. Channels behind the viewer or listener are used to simulate sound approaching from behind the viewer or to provide ambient, spatial, or enveloping sounds. This type of speaker arrangement can allow the viewer or listener to hear a virtual jet or space vehicle fly from their left side to their right side or even from behind.

Surround sound systems also use volume cues to provide the illusion of movement. In the example of a recording of a jet, when the jet is far away the listener will hear a quieter sound. Then as the jet approaches, a speaker's output can increase until it reaches its maximum volume and then the sound decreases as the jet passes away. Directional cues are most often dominated by the speaker(s) having the loudest output. Most program sources tend to have greater signal levels sent to a particular channel at a given point in time to achieve audible direction or movement to the sound.

One disadvantage with such a system is that any one or more of the channels can be driven into overload by high intensity signals building in one channel or high-level directional signals as they move from channel to channel. When the signal passes the maximum signal level threshold of the speaker or amplifier then the sound can become distorted and limited in level. Conventional systems do not provide a solution to this problem, with the exception of increasing the size and power capability of the system to be able to have greater output without overload. This can be very costly and also may require systems of larger than practical size for placement into a domestic environment.

SUMMARY

Figure 1:
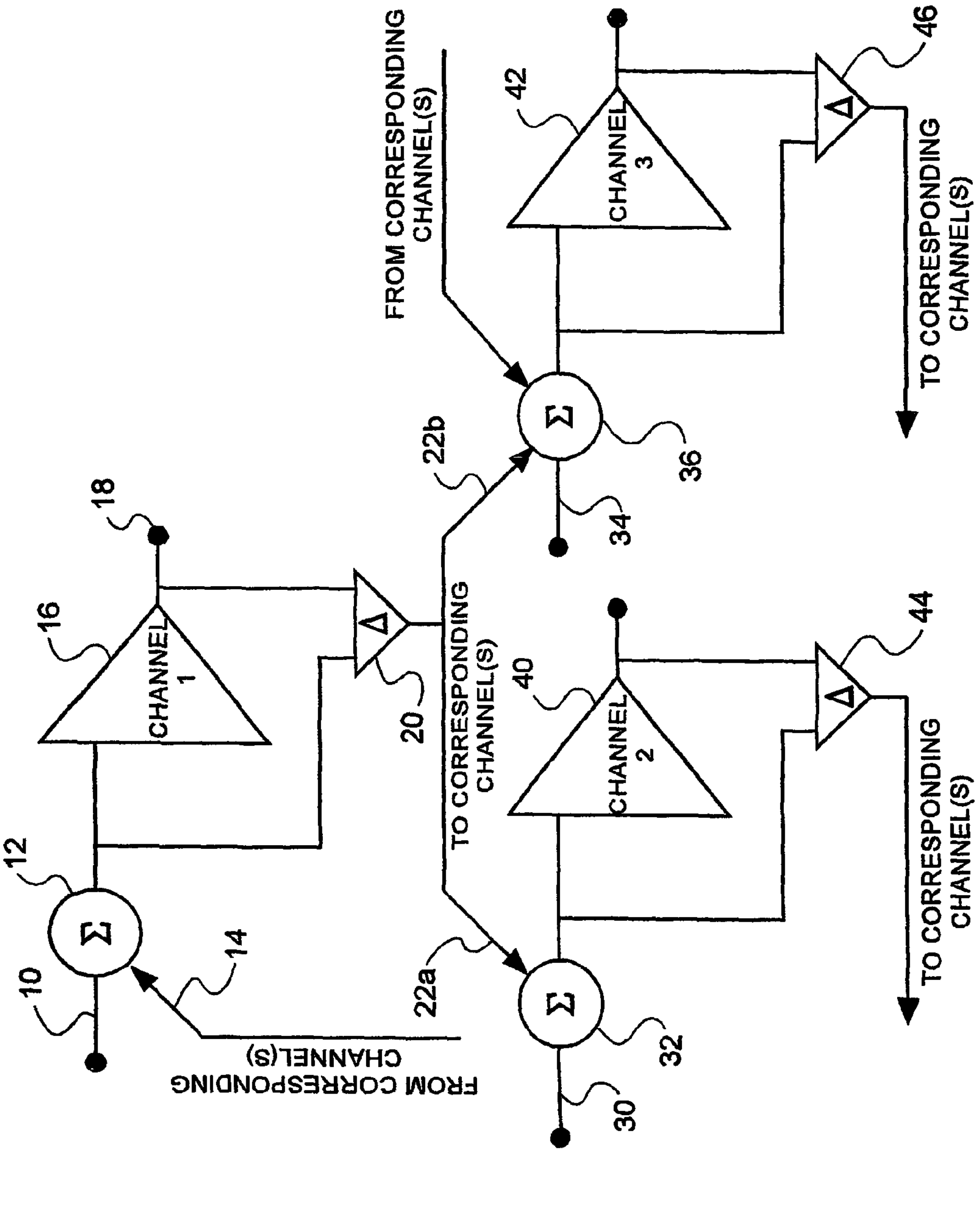
FIG. 1 is a schematic diagram of a preferred embodiment of a circuit for dynamic power sharing in a multi-channel sound system in accordance with the present invention.

A signal processing system for use in a multichannel audio system. The signal processing system includes a first channel having a first audio signal. A second channel is included that has at least a second audio signal. A processor is included that is responsive to a signal level threshold in the first channel, such that at the threshold and above the threshold, a portion of the first channel audio signal is mixed into the at least a second audio channel.

In accordance with a more detailed aspect of the present invention, the system includes a signal processing system for use in a multichannel audio system. The system comprises N channels where n>1 and an audio signal corresponding to each channel. A signal level threshold is associated with each channel. A signal processor is responsive to the signal level threshold such that upon any channel reaching the signal threshold, the signal processor routes at least a portion of the audio signal of the channel reaching the signal threshold to at least one other channel of the multichannel audio system.

Another aspect of the invention provides a method for increasing apparent acoustic output of a multi-channel sound system containing multiple channels where each channel has an audio signal. The first step is selecting at least one signal of at least one channel of the multi channel sound system. Another step is selecting a predetermined parameter threshold corresponding to signal level. A further step is sending a portion of the audio signal associated with at least one channel of the multi-channel sound system to at least one other channel of the multi-channel sound system when the signal reaches the predetermined parameter threshold.

Additional features and advantages of the invention will be apparent from the detailed description which follows, taken in conjunction with the accompanying drawings, which together illustrate, by way of example, features of the invention.

DETAILED DESCRIPTION

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

FIG. 1 illustrates a schematic of one embodiment of a circuit for dynamic power sharing in a multi-channel sound system in accordance with the present invention. A multichannel sound system includes 3 or more channels, such that for any one channel there are two corresponding channels with directional vectors and sound output on each side of the one channel.

In FIG. 1, a channel signal 10 enters a summing amplifier 12. If an overload signal is present then that will be received on a corresponding channel input 14. The original channel signal will be summed with any overload signals and sent to channel 1 s amplifier 16. The original signal or the combination signal can at some point overload the channel. Upon a specified signal threshold, such as amplifier overload of the first channel, the first channel is limited in output and any increases in signal for that channel are routed to the two corresponding channels on each side of the first channel. This is in contrast to conventional systems where the amplifier upon entering into overload can clip or distort the signal before it is delivered to the load 18 or audio transducer.

A differential amplifier 20 is used in the present system to receive a first input from Channel 1 s output and a second input from the sing amplifier. The output of the differential amplifier is the difference between the signal entering the amplifier and the signal leaving the amplifier or the signal amount by which the channel is overloaded. The differential amplifier preferably uses a unity gain but gain can also be used. Gain would only be incorporated into the differential amplifier when an amplified signal was required to be delivered to the corresponding channels. For example, gain might be used if the corresponding overflow channels are more distant from the listener than the original speakers.

The signal from the differential amplifier 20 is routed to at least one other corresponding channel. FIG. 1 illustrates that the difference signal is provided to channel 2 and channel 3 (40 and 42). The summing amplifiers 32, 36 of channels 2 and 3 combine their channel input 30, 34 with the output from the differential amplifier 22*a*, 22*b*. The summed output is then delivered to channels 2 and 3 (32 and 36). This way the system is not limited by the overload of any given channel while maintaining substantially the same directionality of sound. Channels 2 and 3 can also transfer their overload to other channels through their own differential amplifiers 44, 46. This circuit is depicted as an analog circuit but it can also be implemented as a digital signal processor (D SP) or in software which has the same digital functionality.

Each channel has a threshold limit and when the signal passes that threshold then the signal above or near that threshold is passed over to other channels. The threshold limit may be based on, but not limited to, amplifier clipping, excursion limits of the transducer, frequency dependent limiting, thermal limits, etc.

The source channel can be made to include a phase lead compared to the corresponding supplementary channels so as to further support directionality cues psycho-acoustically. When a listener hears the source channel earlier than the supplementary channels, there is further psychoacoustic reinforcement for the user to hear the source channel as the directional source of the sound. The supplementary channels can affect the volume but the user mentally filters out the directionality from those channels because they are heard a very short time later. Delay circuitry can be incorporated between the channels or included as part of the differential amplifier to provide the required phase lead.

If the second or third channels that receive the rerouted signal also reach their signal threshold, that overload can be divided and routed to one or more additional channels. When the present invention is applied to a five-channel system and channel 1 is overloaded, a portion of the signal at or above overload can be rerouted to channels 2 and 3. It may be of further advantage to limit, compress or reduce the gain of the channel reaching an overload threshold and do it in such a way as to limit audible distortion from that channel. If channel 2 or 3 also becomes overloaded, a portion of that signal can be rerouted to channel 4 and/or 5. Although there is some directionality that may be lost through multiple rerouting, this is compensated for by the fact that the re-routing only happens when the sound is very loud and some amount of directionality loss may be less important. Generally, tonal distortion tends to be sonically more noticeable or objectionable to the ear than distortions in directionality. Therefore, it tends to be much more important to eliminate tonal distortions, even if potentially at the cost of some directionality distortion. Accordingly, one embodiment of the invention can substantially eliminate tonal distortions, due to channel overload, while at the same time preserve the accurately perceived directionality cues.

A further threshold detector can be included so if channel 1 starts to limit, then more of channel 1 s signal is shared with channel two than channel three at the limiting point. This way as the signal is portioned off to the other two channels, more of the signal is sent to channel two than channel three. In some cases this can maintain a more accurate spatial image position, such as if channel one is a right front channel, channel two is a center channel and channel three is a right surround channel. This asymmetrical mixing can also be beneficial if channel two is a more robust channel than channel three and therefore can accommodate more signal before it reaches overload. The source channel may also want to have a phase lead relative to the supporting channels or alternatively, the other two supporting channels may include a time delay relative to the primary source channel or other known psycho-acoustic characteristics may be applied to maintain directionality cues in the significant channel(s). A ratio splitter can be included with the differential amplifier circuitry. This way a larger ratio of the signal can be sent to a front speaker and a smaller ratio to the back speaker or vice-versa.

Using a dynamic power sharing configuration also can reduce the cost of the speaker system. Instead of requiring each speaker or amplifier channel to have a large enough capacity to carry the maximum output, each channel or speaker may be reduced to carry a smaller capacity. When the signal exceeds the signal threshold for the smaller speakers, the additional signal is rerouted to the other associated channels. This approach can provide the same amount of apparent sound output as a larger system, while using a smaller overall system, including either lower output speakers and/or reduced amplifier power.

Figure 2:
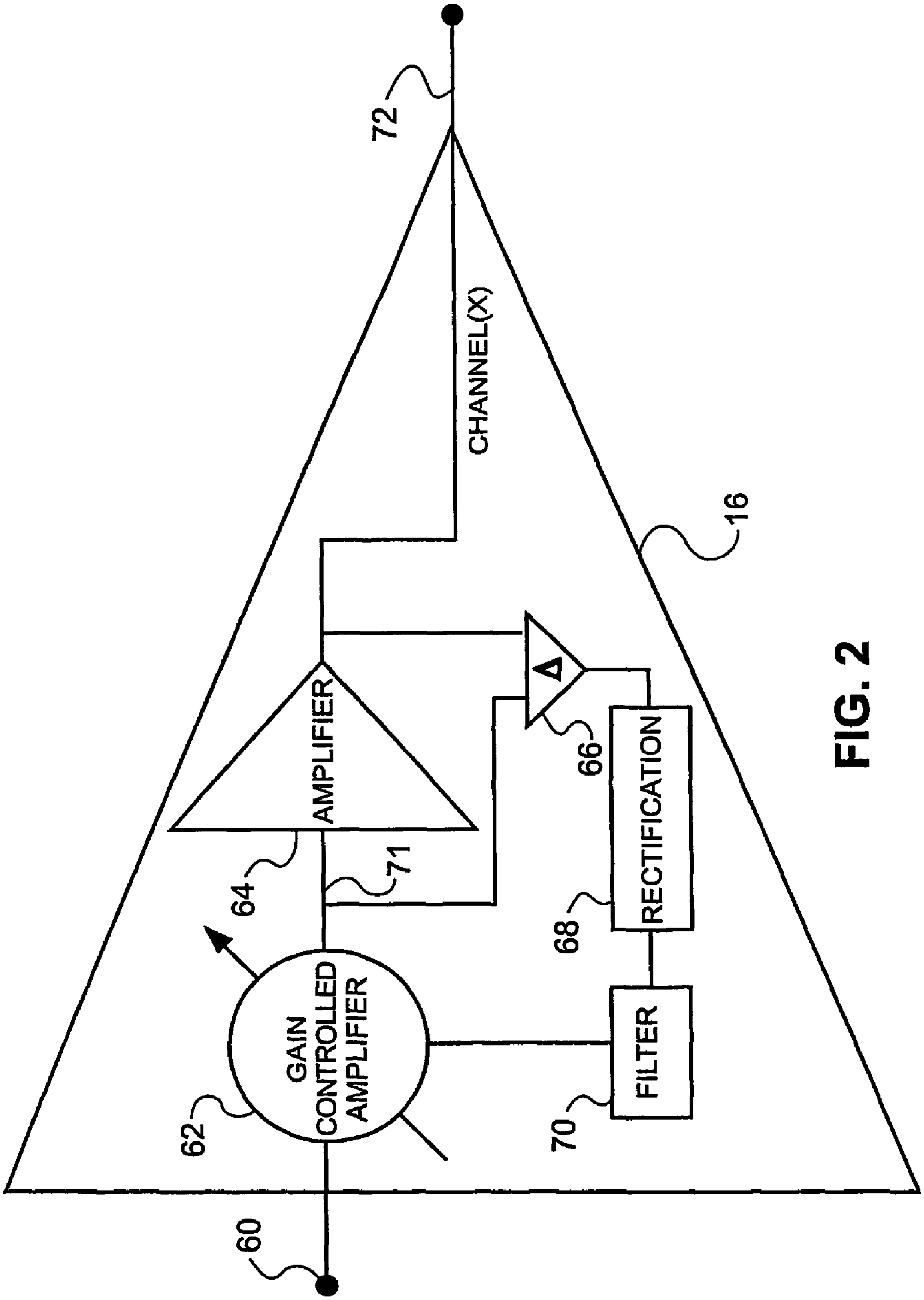
FIG. 2 is a schematic diagram of channels 1-3 in FIG. 1.

FIG. 2 is a schematic of components contained in the channels 1-3 in FIG. 1. The audio signal 60 enters the channel 16 and passes through the gain controlled amplifier 62. The output amplifier 64 then amplifies the signal. A differential amplifier 66 compares the difference between the input signal 71 and the output signal 72 for the output amplifier. When the output amplifier begins to clip or to overload then the output signal will be less than the input signal. The differential amplifier then sends a difference signal to the gain controlled amplifier based on the difference between the input and output of the output amplifier. The gain controlled amplifier has a variable component (such as a variable resistor) which is tuned to hold the signal to a certain level, according to the input from the difference amplifier, and to keep the signal from clipping further. For example, when the output amplifier begins to produce 1% distortion then the gain controlled amplifier can reduce the amplifier gain. This limits the clipping in the output amplifier. A rectification circuit 68 is used to produce an absolute value for the differential signal delivered by the differential amplifier. This way both the positive and negative portions of the signal will have positive gain control to reduce distortion and/or clipping. A filter 70 is used before the differential signal reaches the gain controlled amplifier to remove noise from the feedback circuit.

Figure 2A:
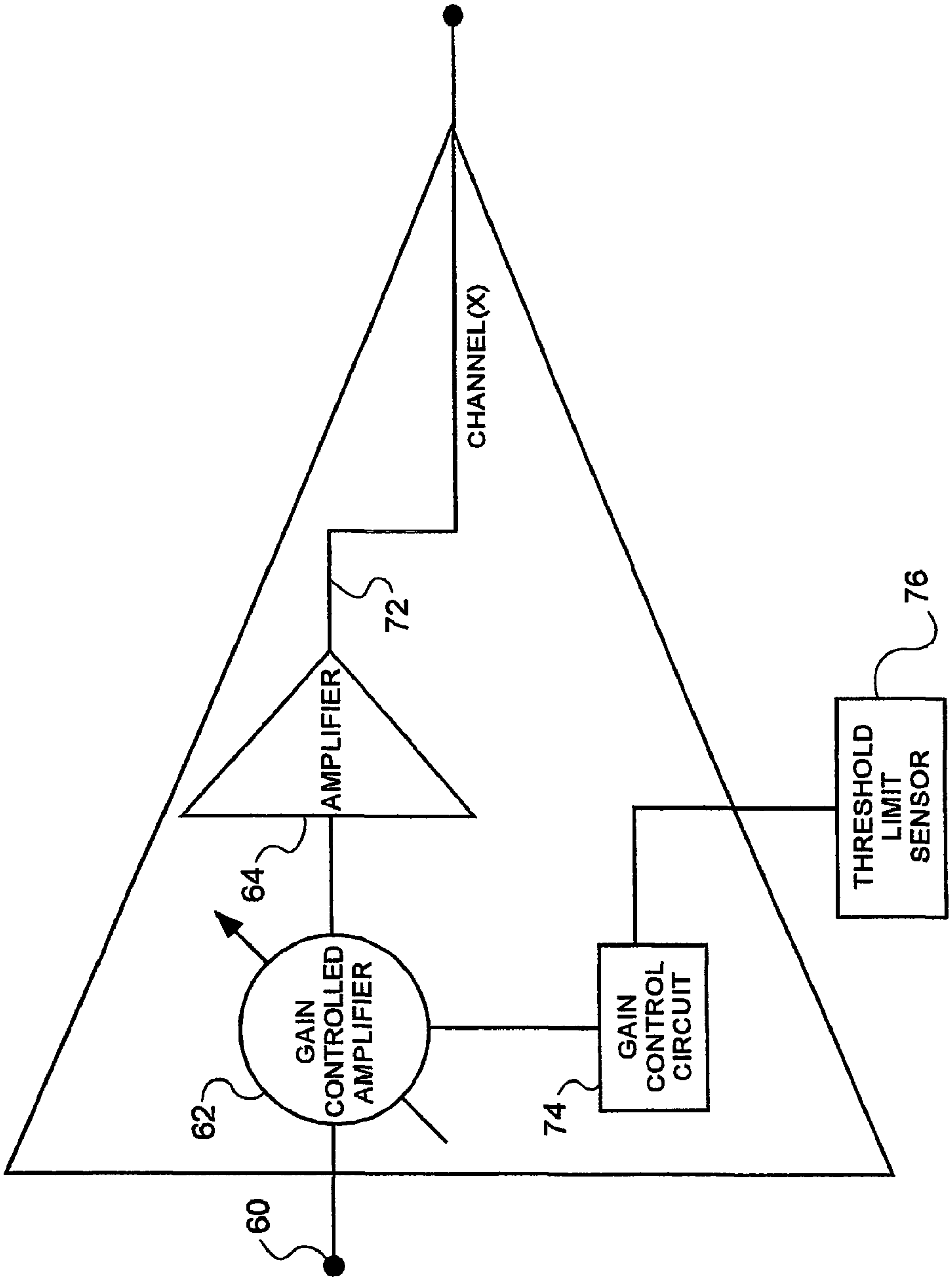
FIG. 2*a* is a schematic diagram of a channel circuit that can sense other threshold parameters besides amplifier power clipping.

The threshold limit at which the first channel begins to transfer power to other channels can be based on signal frequency, thermal characteristics, excursion limits of the transducer, amplifier clipping, physical transducer characteristics, thermal transducer characteristics, thermal effects on amplifier, signal effects on amplifier, power effects on amplifier, and other similar phenomenon which can affect the signal or the components of the system. FIG. 2*a* illustrates a circuit that can sense other threshold parameters besides amplifier clipping. The gain controlled amplifier 62 receives the input signal and passes that to the output amplifier 64 which then delivers an output signal 72 to the load. The gain controlled amplifier is not controlled by an amplifier feedback in this case, but it is controlled by a gain control circuit 74. The signal or voltage produced by the gain control circuit is determined by the threshold limit sensor 76. The threshold limit sensor can be a physical environment sensor, stress gauge sensor, heat sensor, signal sensor, or a voltage sensor.

For example, if the excursion limits of the transducer are defined as the maximum threshold limit, then a sensor can be used at the transducer (e.g., speaker cone) to determine when the transducer approaches the maximum physical displacement before it is damaged. The maximum displacement can also be measured based on the maximum safe voltage threshold for the transducer. When the voltage approaches a maximum voltage that can damage the transducer then the gain control circuit reduces the gain in the gain controlled amplifier. The threshold limit sensor operates in the same fashion for a temperature sensor or a maximum frequency sensor. The signal can also be limited based on the temperature of the operating components.

Figure 3:
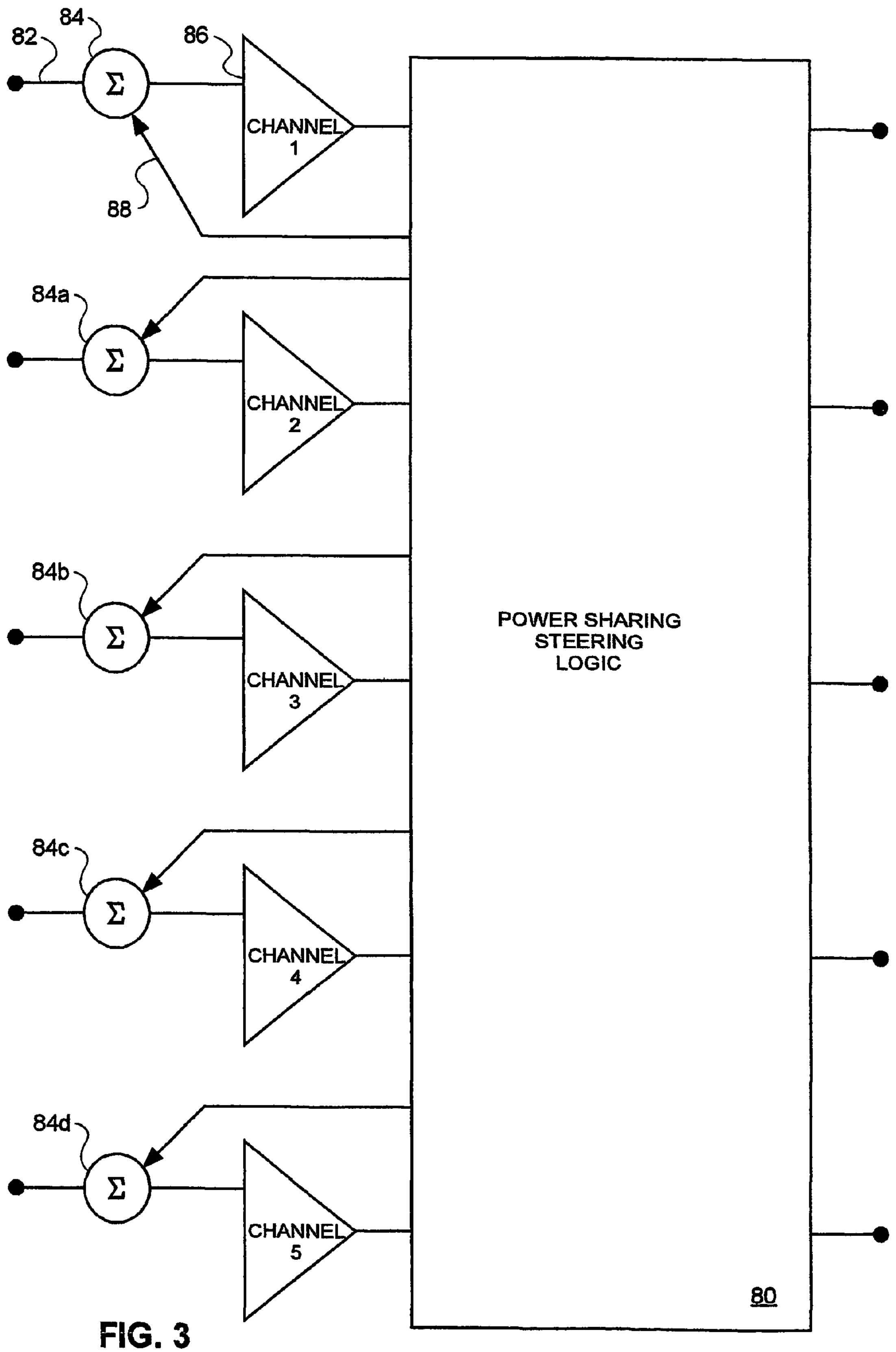
FIG. 3 is a schematic diagram of a multi-channel system with digital power sharing steering logic.

FIG. 3 is a schematic of a multi-channel system with power sharing steering logic. The analog circuits shown FIGS. 1 and 2 may be implemented in a digital signal processing chip (DSP) 80. A first input 82 can be summed together in a summing circuit 84 with overload signals 88 from other channels. The input signal is then passed onto Channel 1 (86) and into the power sharing steering logic. If Channel 1 begins to overload, then that overloaded signal can be diverted to Channel 2 or 3 through their summing circuits 84*a*, 84*b*. It is also possible that portions of the overloaded signal can be diverted to Channels 3 and 4 and incorporated through their summing circuits 84*c*, 84*d*.

The overload signal from one channel may be divided between the other channels in several ways. One method is picking two or more channels corresponding to a primary channel and then dividing the signal equally between them. Another method is dividing the signal between two or more channels based on the physical location of those channels. For example, a rear speaker can have less output delivered to it than a front speaker. It is also possible that a given channel will have any one, two, three or more of the channels as its corresponding channel. Channel 1 can route its signal to channel 5 or to channels 3, 4, and 5. The configuration of the overload is based on the number of channels available, the amount of overload that exists at a given point in time, and the audio image that the system should present. Of course, a preferred embodiment of this device reroutes the overloaded portion of the signal to two other channels.

Dynamic power sharing can be used with two speaker stereo systems. When the first channel reaches the overload signal threshold, then the signal power over that threshold is diverted to the second channel. Similarly, even a multiple channel system can divert the power over a certain threshold to only one channel instead of dividing it between two. While this would ameliorate tonal distortions due to overload, it may still be preferable to mix the signal level above the threshold to at least two additional channels, preferably ones that have speakers straddling the primary channel which can be placed physically between the two additional channels.

Alternatively, the power can be rerouted to three or more other channels based on the directionality that is desired. For example, several channels and transducers can be physically stacked on top of each other. As the first channel begins to overload, the signal can be rerouted to a second speaker that is physically above the first speaker. This maintains directionality and provides a stronger undistorted signal as needed. Since a speaker is only driven to its maximum level a small portion of the time, using two smaller speakers to replace one larger speaker can be space and cost effective.

Figure 4:
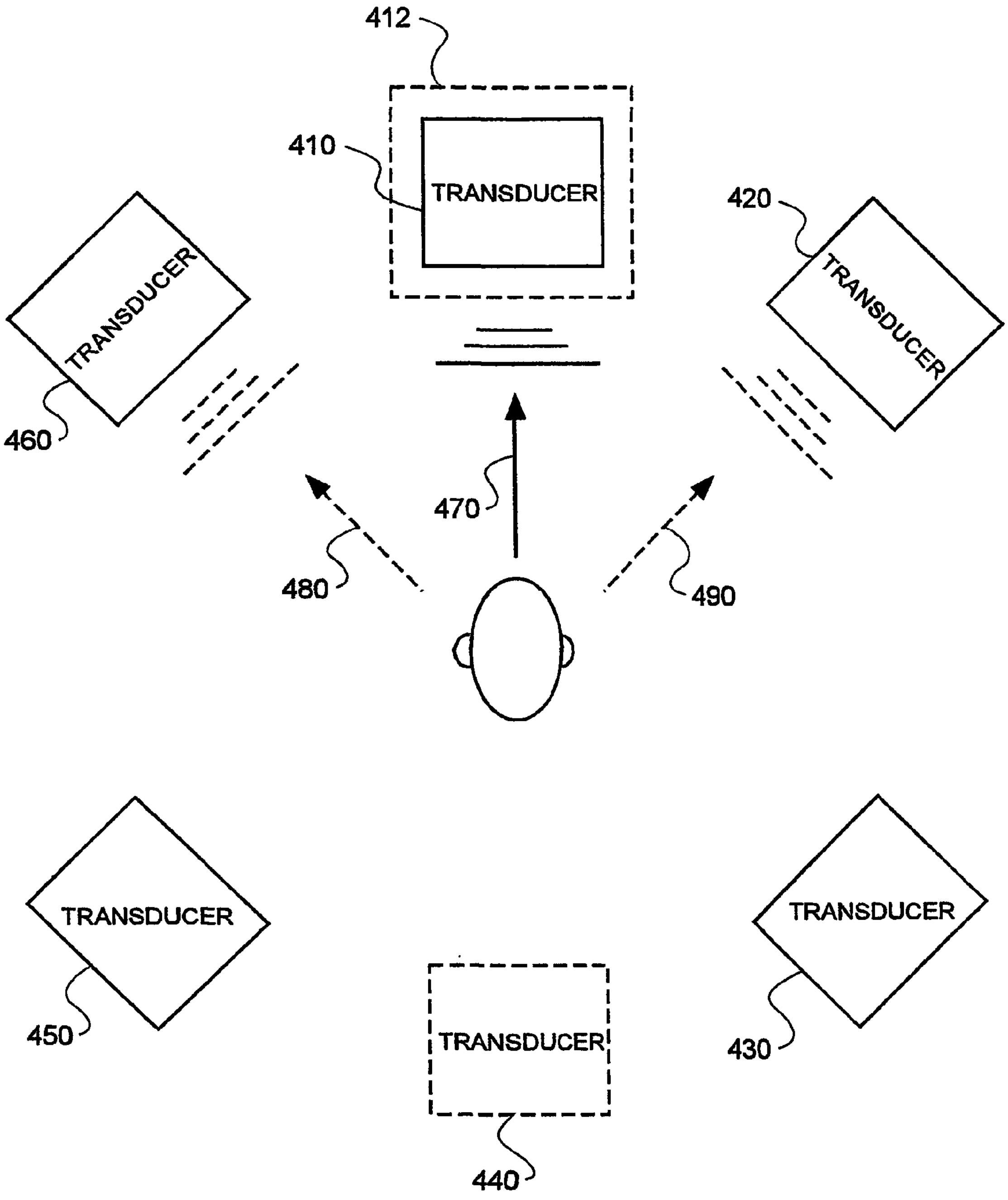
FIG. 4 illustrates power sharing with respect to a center channel.

FIG. 4 illustrates power sharing with respect to a center channel. When a signal that is delivered to the center channel 410, reaches a threshold value, overloads, or reaches a clipping point it can be symmetrically divided and transferred to the counterclockwise 460 and clockwise 420 front channels. In other words, the amount of signal above the threshold is routed to the left 460 and right 420 channels. The signal is divided symmetrically to avoid substantial audio image movement away from the center channel or transducer. This is possible because it is a common practice to locate the two front side channels symmetrically adjacent to the center channel. When the three channels reproduce the divided, overloaded signal, a virtual source 412 is produced that is larger than the output capability of the original center channel. Then if the right and left front channels overload, the signals from these channels can be rerouted to the right 430 and left 450 surround sound channels and their transducers. Some surround sound systems can optionally include a sixth rear speaker 440 and this sixth channel can be used to receive rerouted portions of an overloaded signal from the surround sound channels. Conversely, if the sixth channel overloads then the overload signal can be routed to the adjacent surround channels. If the surround channels overload from the sixth channel, then other channels can be selected to increase the overall sound output. Moreover, the system can send the overloaded portions of the signal to one or more subwoofers in the system. The solid arrow 470 in FIG. 4 represents the primary output direction of the speaker that has reached a threshold, and the dotted vectors 480, 490 represent directional output and cues provided by the auxiliary loudspeakers. The combined dotted vectors create a virtual direction vector that sum together in the direction of the solid line, so that the original direction vector does not audibly move.

Figure 5:
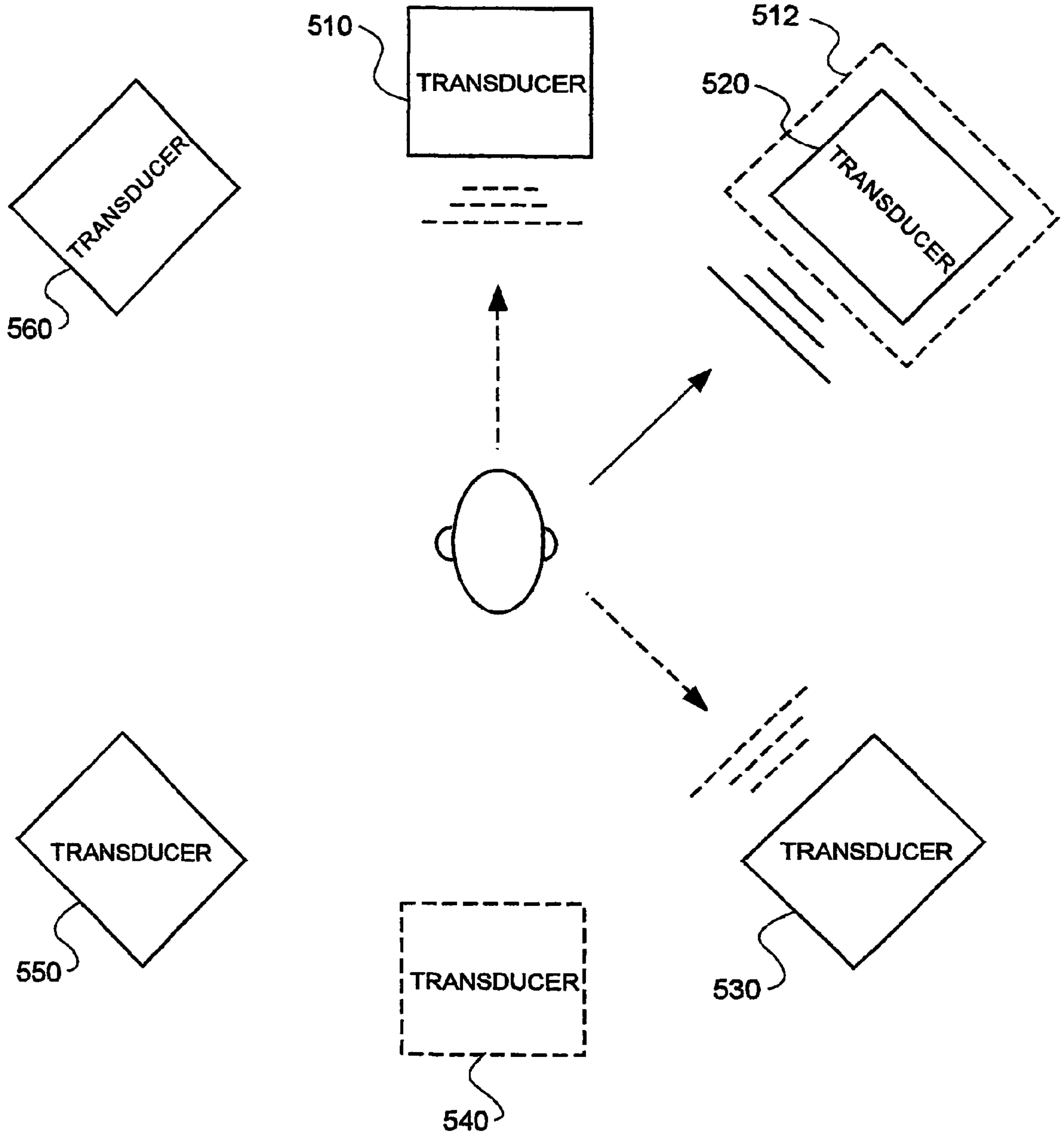
FIG. 5 illustrates power sharing with respect to a side channel.

FIG. 5 illustrates power sharing with respect to a side channel. An overloaded side channel may be treated differently in order to preserve the spatial orientation of the sound image. When the front right transducer overloads, the signal can be divided asymmetrically. The larger portion of the signal overload can be sent to the center channel 510 and the remaining portion of the overloaded signal can be sent to the right rear surround channel 530. Providing the larger portion of the signal to the front right channel helps reduce the sound image drift. If the overload signal is divided symmetrically, then this could cause the sound image to move behind the listener. This is because the surround transducers are usually weaker and placed farther away than the front speakers. As in the previous embodiments, when the speakers to the right and left of the speaker of interest overload, the signal can be rerouted to an adjacent speaker, which is not yet overloaded. For example, in FIG. 5 if the rear surround channel 530 overloads, the overload signal can be rerouted to one or more of the other channels 540, 550. Again, a virtual sound source is created 512, but it actually may be shifted more toward the rear surround speaker than the figure illustrates. Even if the image moves slightly in the present invention, this is much better than having a clipped signal, which provides audible distortion. Humans tend to have reduced levels of psycho-acoustic perception for sounds that move with respect to the side of the head, as compared to sounds that move in front of the face.

The threshold limit at which the first channel begins to transfer power to other channels can be based on any of a variety of parameters such as signal frequency, component thermal characteristics, excursion or displacement of the loudspeaker diaphragm, amplifier clipping, and other similar phenomenon which can affect the original signal, cause damage to a system component, alter performance, or even cause local sound pressure levels to be greater than desired near a single channel. In addition, the triggering threshold could be some combination of any of the parameters or even an arbitrary value to create a desired sonic effect.

Figure 6:
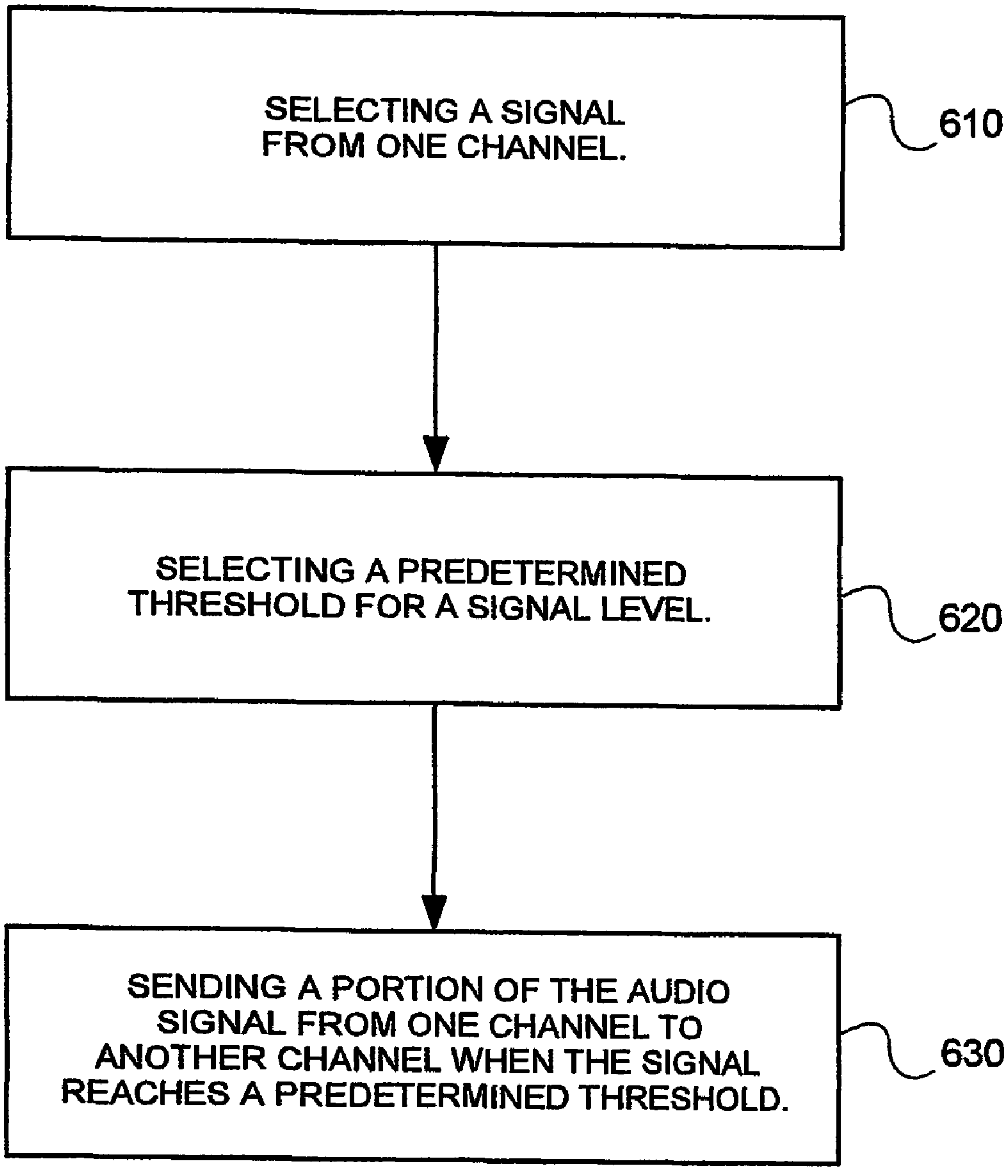
FIG. 6 illustrates a general method for power sharing.

Referring now to FIG. 6, a general method for increasing apparent acoustic output of a multi-channel sound system containing multiple channels, where each channel has an audio signal, will now be described. One step is selecting a signal from a channel of the multi-channel sound system 610. Another step is selecting a predetermined parameter threshold corresponding to signal level 620. A further step is sending a portion of the audio signal associated with at least one channel of the multi channel sound system to at least one other channel of the multi-channel sound system, when the signal reaches the predetermined parameter threshold.

Figure 7:
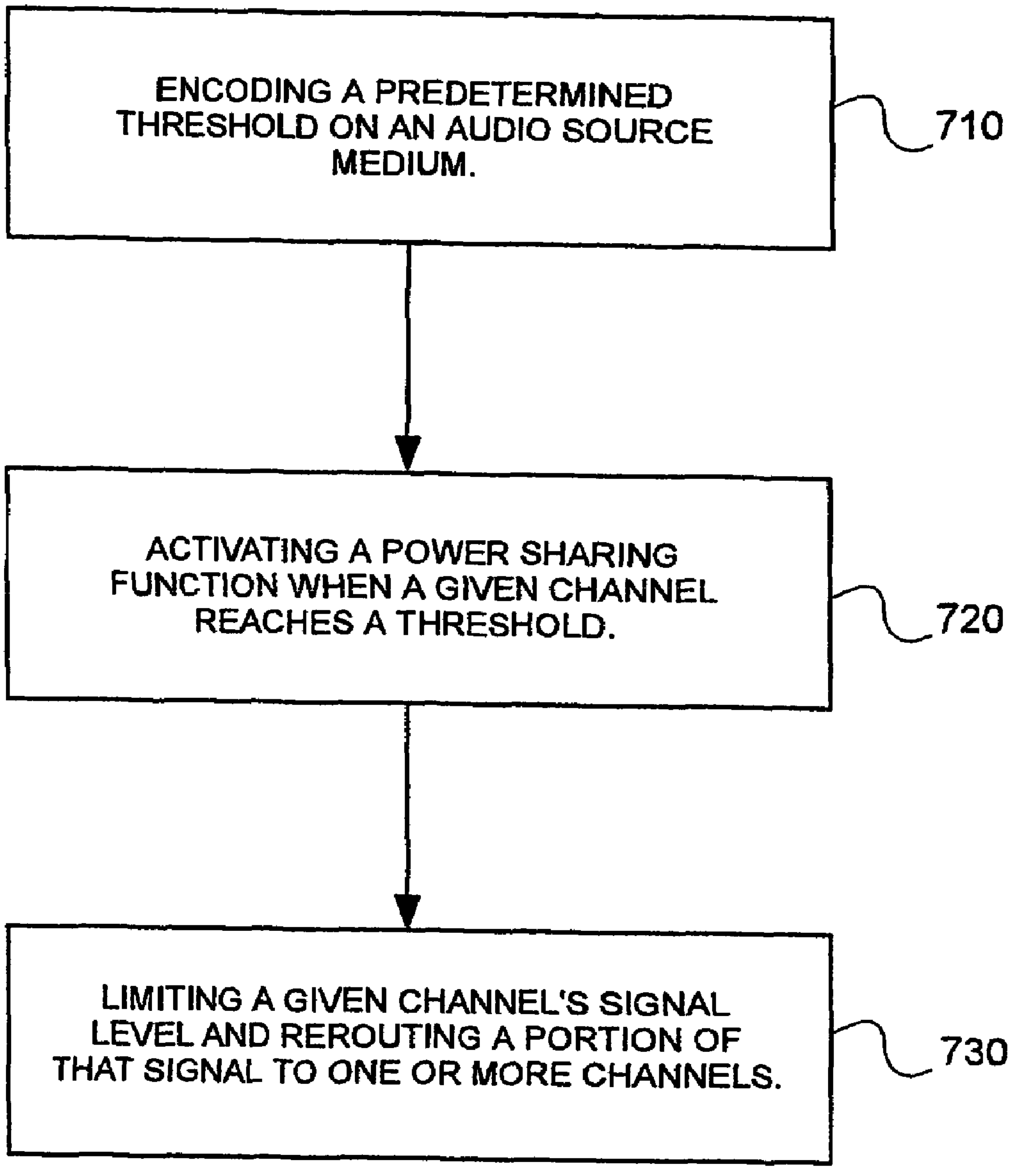
FIG. 7 illustrates a more specific method for power sharing.

FIG. 7 illustrates that it can be useful in some systems to apply the invention in a such a way as to encode the audio program material to be performed with software or hardware control codes prior to or during recording on an audio source medium 710. When a given channel or channels reach a parameter threshold during playback, such as an amplitude threshold, a power sharing function can be activated 720. The power sharing can perform the step of limiting a given channel's signal level and rerouting a portion of that signal to one or more other channels 730. This approach can be generalized to operate with any system to minimize the demands on any particular channel or channels of that system.

In particular, the encoded software approach can be optimized for a particular audio system or can have adaptive settings for re-adapting the threshold parameter(s) for a variety of different systems, each with different characteristics. For example, the use of encoded software or hardware to preprogram power sharing could be implemented by a variety of specific applications, including (i) setting thresholds or implementing preprogrammed thresholds during recording or re-recording of the audio material for listening; (ii) applying arbitrary preset levels as estimated thresholds, based on the specific type of audio system to be used for playback; and (iii) incorporating a simple diagnostic program as part of the hardware or software preprogramming of the recorded material, thereby enabling automatic assessment of the audio system to be used, with derivation of appropriate threshold values from running the diagnostic test sequence. In the latter instance, a CD, flash memory, hard drive or other recorded medium could include an embedded diagnostic sequence that tests system hardware and speakers to identify specific threshold values needed. Other methods for defining and/or preassigning threshold values will be apparent to those skilled in the art, based on the exemplary foregoing description, will be apparent.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in configuration, implementation, form, function and manner of operation, assembly and use may be made, without departing from the principles and concepts of the invention as set forth in the claims.

What is claimed is:

1. A signal processing system for use in a multichannel audio system, comprising:

N channels where n>1;

an audio signal corresponding to each channel;

a signal level threshold associated with each channel;

a signal processor responsive to the signal level threshold such that upon any channel reaching the signal threshold, the signal processor routes at least a portion of the audio signal of the channel reaching the signal threshold to at least one other channel of the multichannel audio system using a technique to minimize disturbance of the audio image projected by the multichannel audio system the technique being selected from the group consisting of: a) volume level of the portion of the audio signal being mixed with that of another channel is held low enough with respect to that of the channel in which it originated that a directional cue to the source of the signal in a listening environment is maintained; b) time delay of the portion of the audio signal being mixed with that of another channel is used and said delay is made long enough with respect to that of the channel in which it originated that a directional cue to the source of the signal in a listening environment is maintained; and c) by mixing said portion into at least two other channels which have transducers connectable to be positioned relative to that of the channel from which the signal originates so that from the perspective of a listener a virtual source of the portion is created in a position close enough to the source of the signal from which it originates that a directional cue as to source is maintained.

2. The signal processing system of claim 1, wherein any number of the N channels reaching the signal threshold will have at least a portion of their audio signals routed to any number of the N other channels in the multichannel audio system.

3. The signal processing system of claim 2, further including a signal limiting function applied to the channels reaching the signal threshold for limiting the signal level in the channels to a predetermined amount.

4. The signal processing system of claim 3, wherein the signal threshold is related to the clipping level of an amplifier associated with the channel reaching the signal threshold.

5. The signal processing system of claim 1, wherein the signal level threshold is related to the excursion limit of the loudspeaker associated with the channel reaching the signal threshold.

6. The signal processing system of claim 1, wherein the signal threshold is frequency dependant.

7. The signal processing system of claim 1, wherein the signal threshold is related to the thermal condition of the loudspeaker associated with the channel reaching the signal threshold.

8. The signal processing system of claim 1, wherein the signal threshold corresponds to overload associated with the channel reaching the signal threshold.

9. The signal processing system of claim 1, wherein the signal threshold is related to a predetermined distortion level associated with the channel reaching the signal threshold.

10. The signal processing system of claim 1, wherein the at least one channel reaching the signal threshold includes the characteristic of a phase lead relative to at least one other channel.

11. The signal processing system of claim 1, further comprising a recorded medium for playback on the signal processing system which includes preset codes for defining signal level threshold values to be applied with respect to program materials contained on the recorded medium, further including a diagnostic program as part of preprogramming of the recorded material for enabling automatic assessment of the audio system to be used, with derivation of appropriate threshold values from running the diagnostic test sequence.

12. The signal processing system as defined in claim 1, wherein the signal processor is responsive to sequentially route at least a portion of the audio signal from multiple channels which sequentially reach the signal threshold to other channels of the multichannel audio system.

13. A method for increasing apparent acoustic output of a multi-channel sound system containing multiple channels, each channel having an audio signal, comprising of the steps of:

(a) monitoring at least one signal of at least one channel of the multi channel sound system as to signal level in comparison to a signal level threshold including a first channel having a first threshold level, a second channel having a second threshold level and a third channel having a third threshold level;

(b) selecting a predetermined parameter threshold corresponding to said signal level threshold and selecting said signal level threshold based on said predetermined parameter threshold; and (c) sending a portion of the audio signal associated with said at least one channel of the multi channel sound system to at least two other channels of the multichannel sound system when the signal reaches the predetermined parameter threshold in such a way that the sound image is minimally disturbed as perceived by a listener wherein there are more than three channels and when as to the first channel, second channel and third channel the first, second and third thresholds are reached the system continues to divert portions to other channels each having a respective signal level threshold until all channels reach their respective level thresholds.

14. The method of claim 13, further comprising the step of providing a limiter function to the audio signal associated with the at least one channel having a signal reaching a predetermined parameter threshold.

15. The method of claim 13, further comprising the steps of:

a) selecting at least three signals of at least three channels of the multi channel sound system represented by at least three corresponding loudspeakers which are positioned in a listening environment such that the first audio channel and corresponding loudspeaker represent a unique direction vector from a listening position representing a real image to the listener; and b) mixing a portion of the signal from the first audio channel which exceeds the predetermined parameter threshold with at least two remaining audio channels.

16. The method as defined in claim 13, further comprising the step of preparing a recorded medium with an embedded code capable of preassigning the parameter threshold for a given multi channel sound system prior to performance of recorded material contained on the recorded medium.

17. The method of claim 16, further comprising the step of preparing a recorded medium with an embedded code capable of applying a diagnostic procedure to the given multi channel sound system for preassigning the parameter threshold prior to performance of the recorded material.

18. A signal processing system for use in a multi-channel audio system, comprising:

(a) a first channel having a first audio signal and a first level threshold;

(b) at least a second channel having a second audio signal and a second signal level threshold and a third channel having a third audio signal and a third signal level threshold, the second and third channels being configured to create a sound source on either side of the first channel with respect to a listener;

(c) a processor responsive to a signal level threshold applicable to the first channel, such that at and above the signal level threshold, a portion of the first channel audio signal is mixed into at least the second and third audio channels so that a virtual sound image source is created close enough to that of the first channel that minimal disturbance of the sound image creatable by the multi-channel audio system results; and wherein there are more than three channels and when as to the first channel,second channel, and third channel the first, second and third threshold is reached the system continues to divert portions to other channels each having a respective signal level threshold until all channels reach their respective signal level thresholds.

19. The signal processing of claim 18, further comprising:

at least first, second, and third audio channels each having corresponding at least first, second, and third loudspeakers positioned in a listening environment corresponding to respective first, second, and third direction vectors from a listening position, the at least first loudspeaker corresponding to the at least the first audio channel being positioned at a directional vector between the second and third loudspeakers.

20. The signal processing of claim 19, wherein:

the three or more audio channels include three or more corresponding loudspeakers positioned in a listening environment such that any first audio channel and corresponding loudspeaker represents a unique direction vector from a listening position, the any first audio channel and corresponding loudspeaker of the audio channels and corresponding loudspeakers having at least two other supplementary audio channels of the audio channels with corresponding loudspeakers having direction vectors from a listening position at clockwise and counter clockwise displacement from the direction vector of the first audio channel;

the signal processor being responsive to a signal level threshold in at least the any first channel such that at and above the threshold a portion of at least any first channel audio signal is mixed into to the at least two supplementary audio channels.

21. The multi-channel signal processing of claim 18, further including a signal limiting function being applied to the first channel corresponding to the signal threshold.

22. The signal processing system of claim 1, further comprising a recorded medium for playback on the signal processing system which includes preset codes for defining signal level threshold values to be applied with respect to program material contained on the recorded medium.

23. The signal processing system of claim 1, further comprising a recorded medium for playback on the signal processing system which includes preset codes for defining signal level threshold values to be applied with respect to program materials contained on the recorded medium, including arbitrary preset levels as estimated thresholds, based on the specific type of audio system to be used for playback.

24. The signal processing system of claim 1, further comprising a recorded medium for playback on the signal processing system which includes preset codes for defining signal level threshold values to be applied with respect to program materials contained on the recorded medium, further including a diagnostic program as part of preprogramming of the recorded material for enabling automatic assessment of the audio system to be used, with derivation of appropriate threshold values from running the diagnostic test sequence.

25. A signal processing system configured for dynamic power sharing in a sound reproduction system comprising:

at least three of channels, each channel connectable to an audio transducer and configured to enable creation of a sound image including a first channel having a first threshold level, a second channel having a second threshold level and a third channel having a third threshold level;

at least one of circuitry and a microprocessor, configured to sense when an audio signal in a channel exceeds a threshold level and enables routing of a portion of said signal to two other channels which have transducers connected and positioned relative to a transducer connected to the first channel such that perceivable disturbance of the sound image at a location of a listener is minimized;

wherein there are more than three channels and when as to the first channel, second channel, and third channel the first threshold level second threshold level and third threshold level are reached the system continues to divert portions to other channels each having a respective signal level threshold until all channels reach their respective signal level threshold.

26. The signal processing system of claim 25, wherein the processor is responsive to a signal level threshold in the at least a second channel, such that at the threshold and above the threshold of the at least a second channel, a portion of the second channel audio signal is mixed into at least one additional audio channel.

27. The signal processing system of claim 25, wherein:

the first, second, and third audio channels each having corresponding first, second, and third loudspeakers are positioned in a listening environment corresponding to respective first, second, and third direction vectors from a listening position, the first loudspeaker being positioned along the first directional vector and between the second and third loudspeakers.

28. A signal processing system as set forth in claim 27, wherein the three or more audio channels represented by the three or more corresponding loudspeakers are positioned in a listening environment such that the first audio channel and corresponding loudspeaker represent a unique direction vector from a listening position representing a real image to the listener, the signal processor being responsive to the signal level threshold in at least the first channel such that at and above the threshold a portion of at least any first channel audio signal is mixed into to at least two supplementary audio channels.

29. A signal processing system as defined in claim 28, wherein the at least two supplementary audio channels reinforce the real image along the first direction vector with a virtual image which corresponds with the real image.

30. A signal processing system as set forth in claim 25 further including a signal limiting function applied to the first channel corresponding to the signal threshold for limiting the signal level in the first channel to a predetermined amount.

31. The signal processing system of claim 25, wherein the signal level threshold is related to the clipping level of an amplifier associated with the channel reaching the signal threshold.

32. The signal processing system of claim 25, wherein the signal threshold is related to the excursion limit of the loudspeaker associated with the channel reaching the signal threshold.

33. The signal processing system of claim 25, wherein the signal level threshold is frequency dependant.

34. The signal processing system of claim 25, wherein the signal threshold is related to the thermal condition of the loudspeaker associated with the channel reaching the signal threshold.

35. The signal processing system of claim 25, wherein the signal threshold corresponds to overload associated with the channel reaching the signal threshold.

36. The signal processing system of claim 25, wherein the signal threshold is related to a predetermined distortion level associated with the channel reaching the signal threshold.

37. The signal processing system of claim 25, wherein the at least one channel reaching the signal threshold includes the characteristic of a phase lead relative to at least one other channel.

38. The signal processing system of claim 25, wherein at least one other channel other than the at least one channel reaching the signal threshold has a time delay relative to the at least one channel reaching the signal threshold.

39. The signal processing system of claim 25, further comprising a recorded medium for playback on the signal processing system which includes preset codes for defining signal level threshold values to be applied with respect to program material contained on the recorded medium.

40. The signal processing system of claim 25, further comprising a recorded medium for playback on the signal processing system which includes preset codes for defining signal level threshold values to be applied with respect to program materials contained on the recorded medium, including arbitrary preset levels as estimated thresholds, based on the specific type of audio system to be used for playback.

41. A method as set forth in claim 13, wherein minimizing disturbance of the sound image further comprises at least one of the following steps:

a) adjusting volume level of the portion of the audio signal being mixed with that of another channel is held low enough with respect to that of the channel in which it originated that a directional cue to the source of the signal in a listening environment is maintained;

b) providing time delay of the portion of the audio signal being mixed with that of another channel is used and said delay is made long enough with respect to that of the channel in which it originated that a directional cue to the source of the signal in a listening environment is maintained; and, c) mixing said portion into at least two other channels which have transducers connectable to be positioned relative to that of the channel from which the signal originates so that from the perspective of a listener a virtual source of the portion is created in a position close enough to the source of the signal from which it originates that a directional cue as to source is maintained.

42. A system as set forth in claim 18, further comprising at least one of:

a) an adjustment for the volume level of the portion of the audio signal being mixed with that of another channel which keeps it held low enough with respect to that of the channel in which it originated that a directional cue to the source of the signal in a listening environment is maintained; b) a time delay of the portion of the audio signal being mixed with that of another channel is used and said delay is made long enough with respect to that of the channel in which it originated that a directional cue to the source of the signal in a listening environment is maintained; and c) a mixer of said portion into at least two other channels which have transducers connectable to be positioned relative to that of the channel from which the signal originates so that from the perspective of a listener a virtual source of the portion is created in a position close enough to the source of the signal from which it originates that a directional cue as to source is maintained.

43. A system as set forth in claim 18, wherein the system allows repeated diversion of portions of the signal in each channel so that it spreads out load until all channels simultaneously reach the threshold signal level and are limited altogether at said level, in each case until reaching the limit altogether the system continues to preserve directional cues to the extent possible to minimally disturb the sound image.

* * * * *